United States Patent [19]

Jun et al.

[11] Patent Number: 5,229,315
[45] Date of Patent: Jul. 20, 1993

[54] METHOD FOR FORMING AN ISOLATED FILM ON A SEMICONDUCTOR DEVICE

[75] Inventors: Young K. Jun; Young S. Kim, both of Seoul, Rep. of Korea

[73] Assignee: Gold Star Electron Co., Ltd., Rep. of Korea

[21] Appl. No.: 822,020

[22] Filed: Jan. 16, 1992

[30] Foreign Application Priority Data

Jan. 16, 1991 [KR] Rep. of Korea .................. 640/1991

[51] Int. Cl.⁵ .............................................. H01L 21/76
[52] U.S. Cl. ........................................ 437/67; 437/72; 437/63; 437/64; 148/DIG. 50
[58] Field of Search ................ 437/67, 72, 63, 64, 437/968; 148/DIG. 50; 257/374, 395-399, 510, 513, 519, 520, 647, 648

[56] References Cited

U.S. PATENT DOCUMENTS

| | | | |
|---|---|---|---|
| 4,551,911 | 11/1985 | Sasaki et al. | 437/67 |
| 4,633,290 | 12/1986 | Poppert et al. | 257/374 |
| 4,704,786 | 11/1987 | Kub | 437/225 |
| 4,717,682 | 1/1988 | Taka et al. | 437/233 |
| 5,061,652 | 10/1991 | Bendernagel et al. | 437/81 |
| 5,073,813 | 12/1991 | Morita et al. | 357/49 |
| 5,089,435 | 2/1992 | Akiyama | 437/44 |
| 5,094,966 | 3/1992 | Yamazaki | 437/40 |

FOREIGN PATENT DOCUMENTS 0001243 1/1987 Japan ........................ 437/67
0016751 1/1988 Japan .

*Primary Examiner*—Brian E. Hearn
*Assistant Examiner*—Trung Dang

[57] ABSTRACT

The present invention relates to a method for forming an isolated film on a semiconductor device in the shape of a cylinder to shorten the heat treatment process and to prevent a micro-loading effect of filling of a field-isolated oxide film. The method comprises the step of forming a deep, narrow groove, then filling up the groove with an oxide film, and then oxidizing a polysilicon layer encircled by the groove to form an isolated film in the shape of a cylinder.

2 Claims, 4 Drawing Sheets

METHOD FOR FORMING AN ISOLATED FILM ON A SEMICONDUCTOR DEVICE

BACKGROUND OF THE INVENTION

The present invention relates to a method for forming an isolated film on a semiconductor device in the shape of a cylinder within a substrate by using a complex mask to shorten a heat treatment process and to prevent a micro-loading effect of filling of an oxide film.

In order to fully appreciate the scope of the present invention, the conventional fabrication process used in forming an isolated film on a semiconductor device according to the prior art will be described in more detail with reference to accompanying FIGS. 1A through 1F.

As shown in FIG. 1A, a pad oxide film 12 and a silicon nitride film 13 are formed on the Si substrate 11 in order. Nitride film 13 and pad oxide layer 12 are etched using a photoetching method by using the photosensitive material 14 to form a trench window, and then the Si substrate 11 is etched to form a trench and the remaining photosensitive material 14 is removed.

As shown in FIG. 1B, a p-type polysilicon layer 15, which functions as a channel stop diffusion source, is then deposited on the whole surface.

At this time, a BSG layer can be used for a channel stop diffusion source. Then, as shown in FIG. 1C, photosensitive material 16 is coated and etched to remove only a portion of the trench and an n-type well is formed through a photoetching process. The p-type polysilicon layer 15 is etched to remove only a portion thereof from the area at which the n-type well is formed and the photosensitive material 16 is then removed.

As shown in FIG. 1D, boron ions are diffused to form a field channel stop layer 18.

Furthermore, as shown in FIG. 1E, the p-type polysilicon layer 15 is removed and then a thermal oxide thin film 19 is formed within the formed trench. A CVD oxide film 20 is formed on the whole surface and a polymer 21 is coated on the concave portion to level the surface of the CVD oxide film 20.

Subsequently, as shown in FIG. 1F, the CVD oxide film 20 is dry etched to the surface of the nitride film 13 to form a semiconductor device on which the surface of the isolated film is leveled.

However, in the above-mentioned conventional technique for forming an isolated film, because a Si substrate is vertically etched in order to form a trench, a crystal defect is generated in the side of the trench formed within the Si substrate in forming a CVD oxide film.

Besides, when the polymer is coated in the concave portion of the CVD oxide film and the CVD oxide film is then etched in order to level the surface of the isolated film, if a difference in the pattern size of the isolated region will be generated, grooving of a field-isolated oxide is generated by the loading effect in a comparatively large pattern.

SUMMARY OF THE INVENTION

It is an object of this invention to provide a method for forming a leveled field-isolated film on a semiconductor device, regardless of the pattern size of the isolated region.

In order to achieve this object of the present invention, there is provided a method for forming an isolated film on a semiconductor device which comprises the steps of:

Forming a deep and narrow cylindrical groove in a substrate;

Filling up the groove with an oxide film; and

Oxidizing a polysilicon layer encircled by the groove, thereby forming an isolated film in the shape of a cylinder.

BRIEF DESCRIPTION OF THE DRAWINGS

These and other objects of the invention will be better understood upon study of the Detailed Description of the invention, below, together with the drawings in which.

DETAILED DESCRIPTION OF THE INVENTION

The method (according to the embodiment of the present invention) for forming a leveled field-isolated film on a semiconductor device, regardless of the pattern size of the isolated region, will now be described with reference to FIG. 2.

Figure 1A:
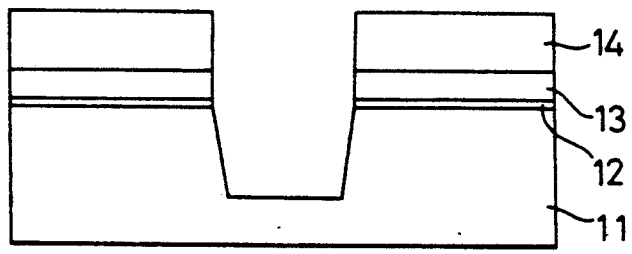
FIGS. 1A through F are schematic views of the fabrication process for forming an isolated film on a semiconductor device according to the prior art.
Figure 1B:
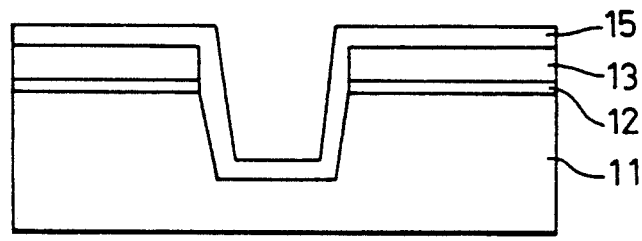
Figure 1C:
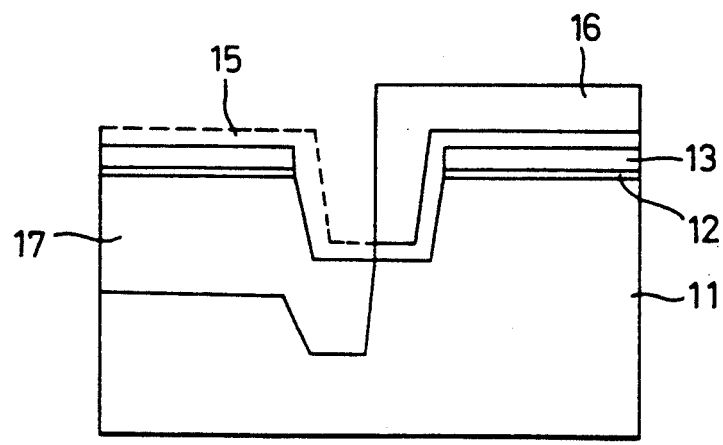
Figure 1D:
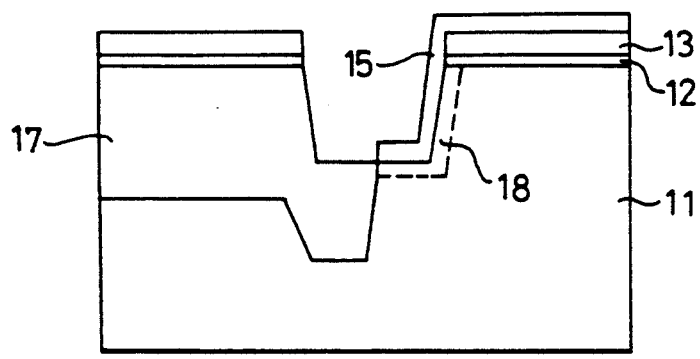
Figure 1E:
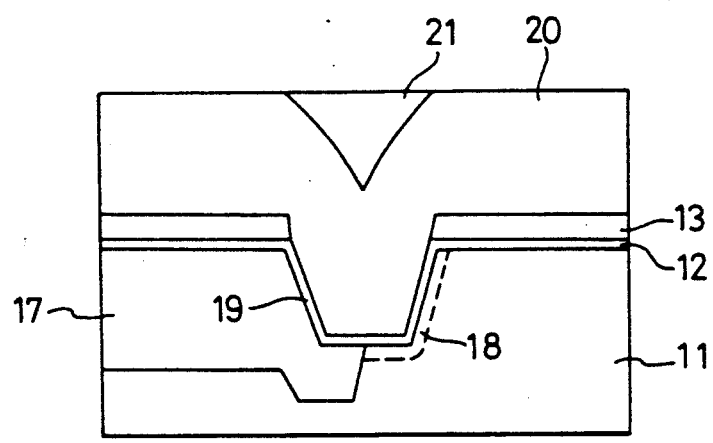
Figure 1F:
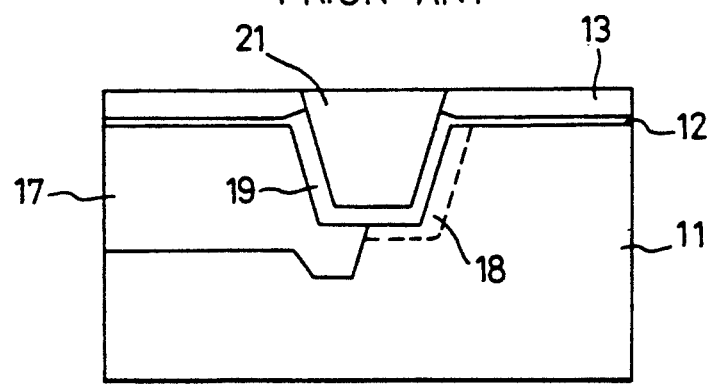
Figure 2A:
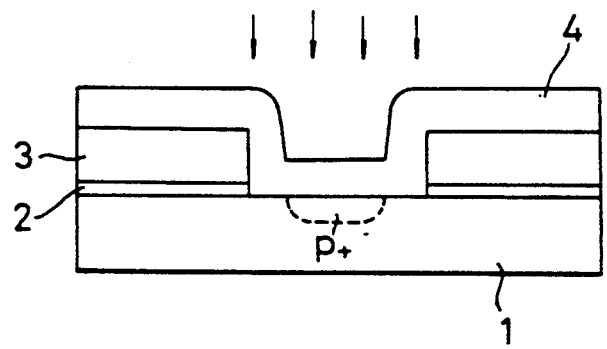
FIGS. 2A through F are schematic views of the fabrication process for forming an isolated film on a semiconductor device according to the present invention.

First, as shown in FIG. 2A, the pad oxide film 2 and the nitride film 3, as a mask for oxidation and trench formation, are formed on the Si substrate 1 and then etched by a photoetching process to form a mask window. A polysilicon layer 4 of predetermined thickness is deposited and p+ field stop ions are implanted.

At this time, the width of the groove which will be formed within the Si substrate 1 in the following process, is determined according to the thickness of the deposited polysilicon layer 4 in the window area formed between the oxide layers.

Figure 2B:
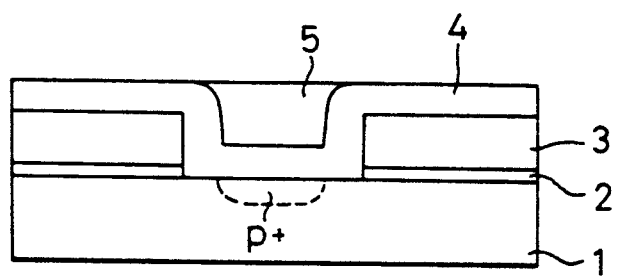
Figure 2C:
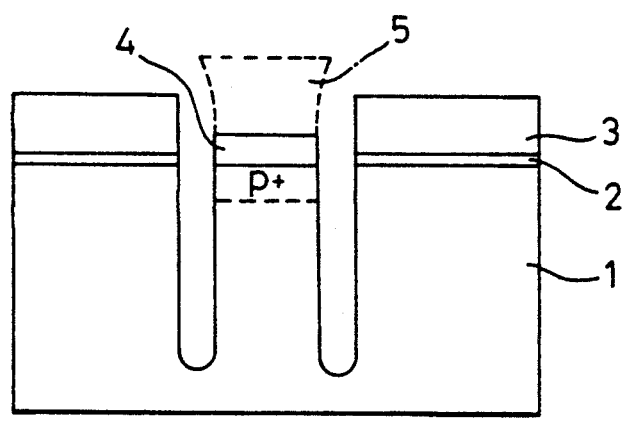

Then, as shown in FIG. 2B, an insulated layer 5 for leveling the surface is formed and etched back to level the surface. Then, as shown in FIG. 2C, the polysilicon layer 4 and the Si substrate 1 are etched vertically with a self-alignment method to form a deep and narrow groove 4A within the Si substrate 1.

Figure 2D:
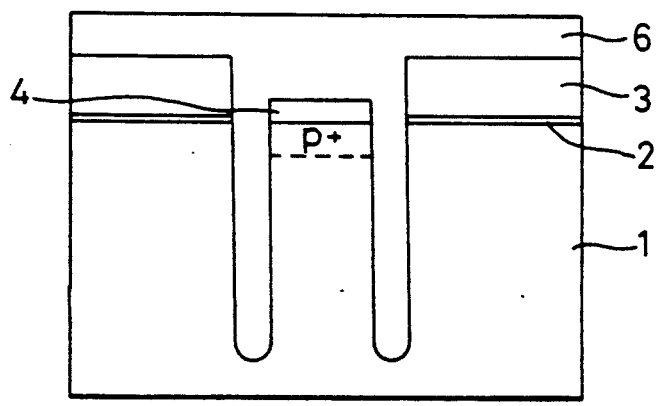
Figure 2E:
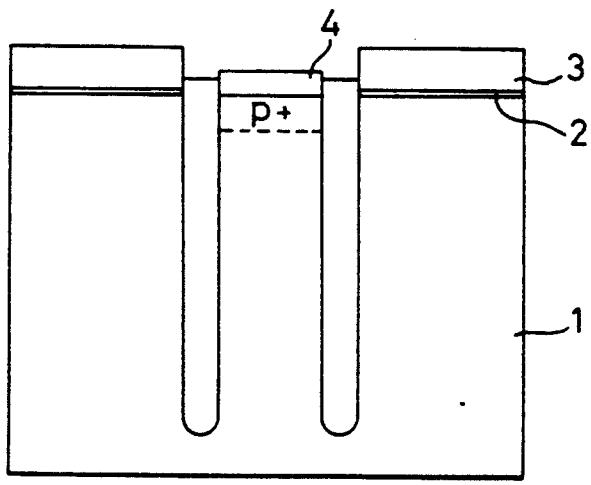

Subsequently, as shown in FIG. 2D, the insulated layer 5 is removed and a CVD oxide film 6 is formed on the whole surface and, as shown in FIG. 2E, is etched back by using a dry etching method to expose the polysilicon layer 4.

Figure 2F:
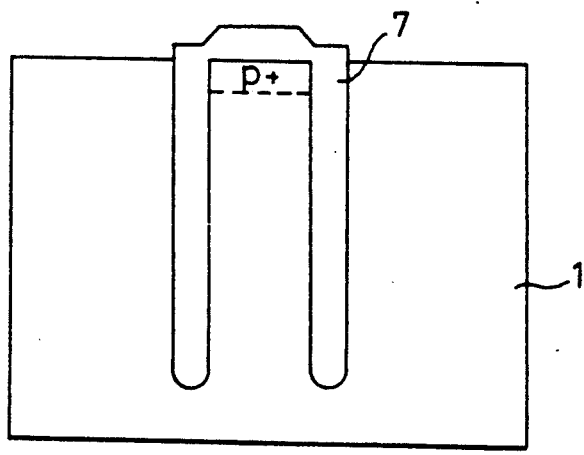

As shown in FIG. 2F, the polysilicon layer 4 is then oxidized and the nitride film 3 is removed to form a field-isolated oxide film 7 in the shape of a cylinder.

According to the present invention, the leveled field-isolated oxide film can be formed regardless of pattern size of the isolated region, so that the grooving of a field-isolated oxide film due to a loading effect can be prevented.

It will be understood by those skilled in the art that the foregoing description is in terms of a preferred embodiment of the present invention wherein various changes and modifications may be made without departing from the spirit and scope of the invention as set forth in the appended claims.

What is claimed is:

1. A method for forming an isolated film on a semiconductor device comprising the steps of:

forming a deep and narrow cylindrical groove in a substrate;

filling up the groove with an oxide film, and oxidizing a polysilicon layer encircled by the groove, thereby forming an isolated film in the shape of a cylinder.

2. In the method for forming an isolated film on a semiconductor device according to claim 1, the steps of:

forming a pad oxide film and a nitride film on the substrate in that order;

forming a mask window using a photoetching process, for depositing a polysilicon layer and for implanting field ions in the polysilicon layer;

forming an insulated layer over the mask region for leveling the surface and then etching back the insulated layer to level the surface;

etching said polysilicon layer and said substrate using a self-alignment method to form a deep cylindrical groove within said substrate;

forming a CVD oxide film into said groove and over the polysilicon layer and etching it back by using a dry etching method to expose said polysilicon layer; and oxidizing said polysilicon layer to remove said nitride film.

* * * * *